United States Patent [19]

Sakurai

[11] Patent Number: 4,974,203
[45] Date of Patent: Nov. 27, 1990

[54] ARRANGEMENT AND CONSTRUCTION OF AN OUTPUT CONTROL CIRCUIT IN A SEMICONDUCTOR MEMORY DEVICE

[75] Inventor: Takayasu Sakurai, Tokyo, Japan
[73] Assignee: Kabushiki Kaisha Toshiba, Kawasaki, Japan
[21] Appl. No.: 274,594
[22] Filed: Nov. 22, 1988
[30] Foreign Application Priority Data
Nov. 30, 1987 [JP] Japan .................. 62-302681
[51] Int. Cl.⁵ .................. G11C 5/06; G11C 7/00
[52] U.S. Cl. .................. 365/63; 365/189.05
[58] Field of Search .................. 365/51, 63, 189.05
[56] References Cited
U.S. PATENT DOCUMENTS

| | | | |
|---|---|---|---|
| 4,344,156 | 8/1982 | Eaton, Jr. et al. | 365/189.05 |
| 4,602,353 | 7/1986 | Wawersig et al. | 365/189.05 |
| 4,604,731 | 8/1986 | Konishi | 365/189.05 |
| 4,827,454 | 5/1989 | Okazaki | 365/189.05 |
| 4,831,590 | 5/1989 | Ichinose | 365/189.05 |

Primary Examiner—Glenn Gossage
Attorney, Agent, or Firm—Finnegan, Henderson, Farabow, Garrett, and Dunner

[57] ABSTRACT

A semiconductor memory device includes output control circuits which are located adjacent to column sense amplifiers and output transistors which are located at a distance from the output control circuits. The wiring length of a first wiring from the column sense amplifiers to the output control circuits is set to be shorter than the wiring length of a second wiring from the output control circuits to the output transistors. The second wiring has a parasitic capacitance at least five times the parasitic capacitance of the first wiring.

9 Claims, 6 Drawing Sheets

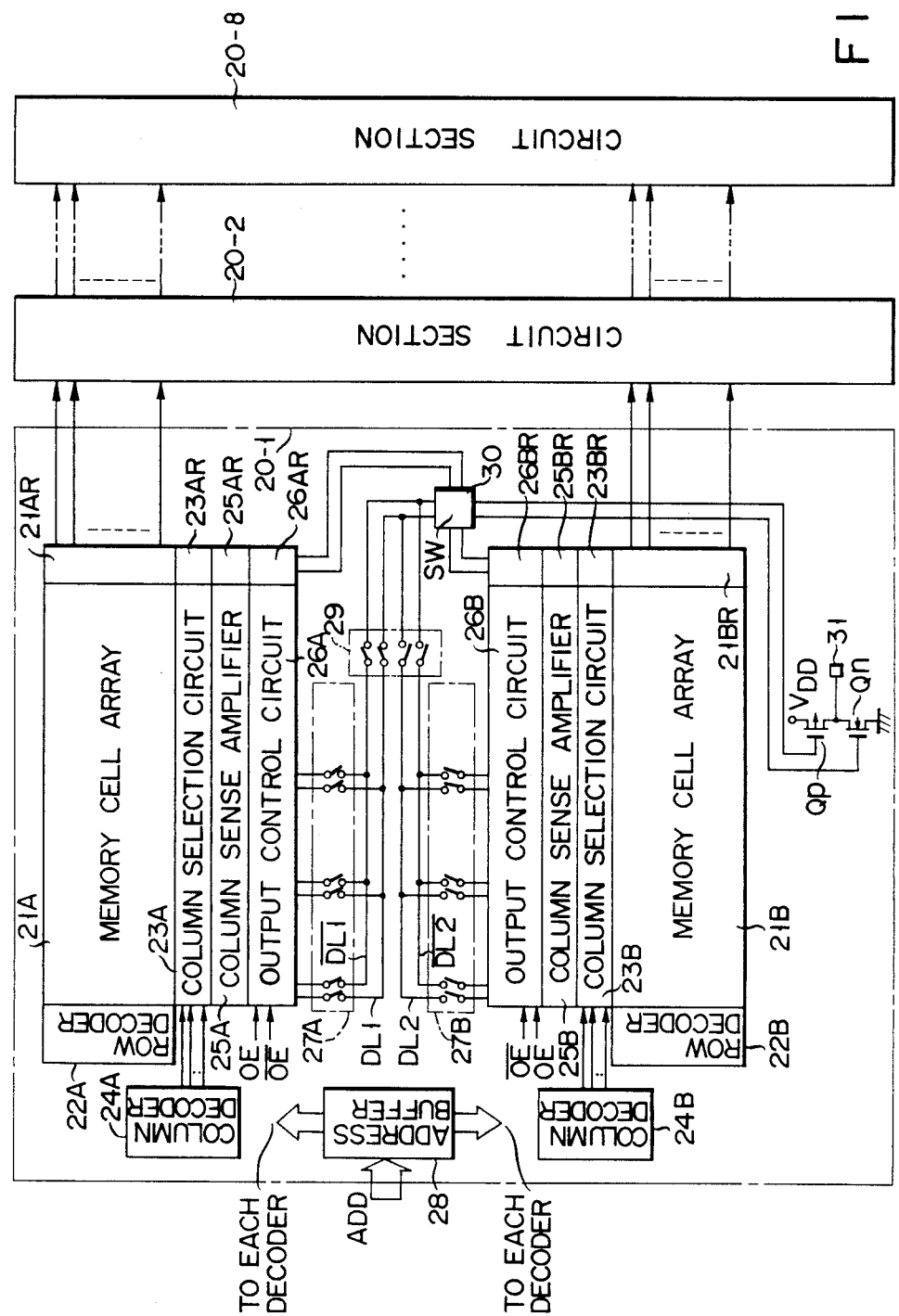

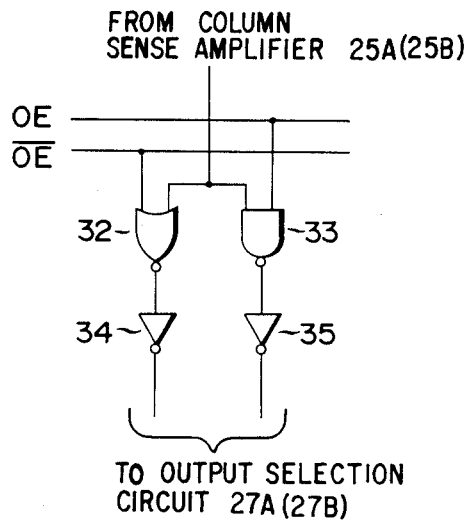
F I G. 7

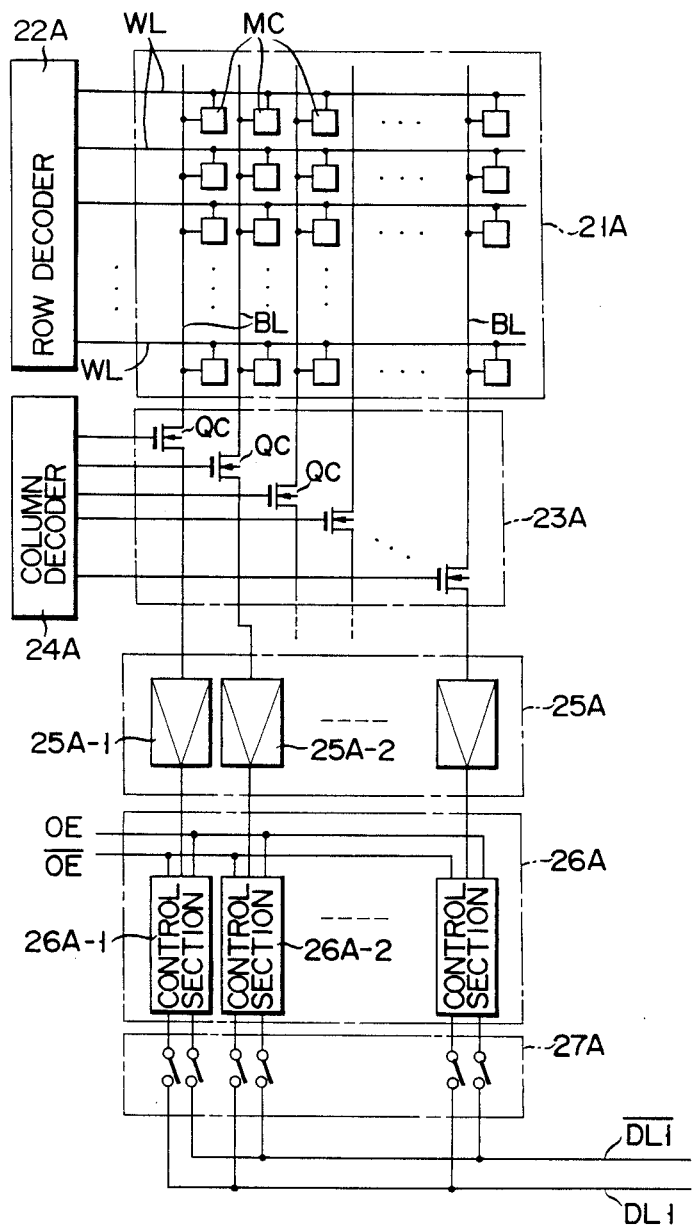
F I G. 10

ARRANGEMENT AND CONSTRUCTION OF AN OUTPUT CONTROL CIRCUIT IN A SEMICONDUCTOR MEMORY DEVICE

BACKGROUND OF THE INVENTION

1. Field of the Invention

This invention relates to a semiconductor memory device, and more particularly to the arrangement and construction of an output circuit for a column sense amplifier and data output transistor.

2. Description of the Related Art

A typical example of the conventional semiconductor memory device is schematically constructed as follows. A large number of memory cells are arranged in a matrix form in a memory cell array. An address buffer, row decoder, column sense amplifier, column decoder and the like are provided adjacent to the memory cell array. Address data temporarily stored in the address buffer is supplied to the row decoder and column decoder. The row decoder and column decoder select one of the memory cells. That is, when the row decoder selects one of the rows of memory cells, memory cells connected to the selected row are activated. Data read out from the activated memory cells are supplied to the column sense amplifier via bit lines connected to the respective activated memory cells and amplified by the amplifier. One of the signals amplified by the column sense amplifier is selected by selecting one of the columns of the memory cell array by the column decoder. Data read out from the selected memory cell is supplied to an output circuit via data lines. The output circuit includes a main sense amplifier and an output control circuit. The output control circuit is used to control the conduction states of output transistors (a P-channel MOS transistor and an N-channel MOS transistor whose current paths are connected in series with each other between power sources $V_{DD}$ and $V_{SS}$). The output control circuit causes to be output from a connection node between the output transistors under the control of output enable signal $\overline{OE}$, and causes the output terminal to be set at a high impedance state.

In a case where the memory cell array is divided into a plurality of blocks, a row decoder, a column decoder and a column sense amplifier are provided for each of the memory cell array blocks. Further, an array selection circuit for selecting data read out from the memory cell array block is provided Data read out from the memory cell array block selected by the array selection circuit is supplied to the output circuit.

In the above semiconductor memory device, the output circuit is constructed as shown in FIG. 1. The source of output MOS transistor Qp is connected to $V_{DD}$ power source terminal 11 and $V_{DD}$ power source line 12 in the chip. A wiring between transistor Qp and $V_{DD}$ power source terminal 11 has inductance component L1 due to a bonding wire or the like. Inductance component L1 is shown surrounded by a dashed line to indicate that it is a parasitic element. The source of output MOS transistor Qn is connected to $V_{SS}$ power source (ground terminal) and $V_{SS}$ power source line 13 in the chip. A wiring between transistor Qn and $V_{SS}$ power source also has inductance component L2 due to a bonding wire or the like. Inductance component L2 is shown surrounded by a dashed line to indicate that it is a parasitic element. The drains of transistors Qp and Qn are connected to each other, and connected to output terminal 14 for outputting output signal Vout to the exterior. Output load capacitor Cl is connected between output terminal 14 and the $V_{SS}$ power source. Inductance component L3 also exists between output terminal 14 and output load capacitor Cl. Inductance component L3 is shown surrounded by a dashed line to indicate that it is a parasitic element. The conduction state of transistor Qp is controlled by potential VGP supplied from inverter 16 provided at the output stage of output control circuit 15. Likewise, the conduction state of transistor Qn is controlled by potential VGN supplied from inverter 17 provided at the output stage of output control circuit 15. Further, internal circuit 18 is connected between $V_{DD}$ power source line 11 and $V_{SS}$ power source line 12.

If inductance components L1 to L3 exist as described above, the source potential ($V_{SS}'$ potential in the chip) of N-channel MOS transistor Qn will significantly fluctuate as shown in FIG. 2A when N-channel MOS transistor Qn is turned on at a high speed to invert the potential of output terminal 14 from the high level to the low level (that is, discharge charges of output terminal 14). If such a large potential variation (noise) occurs, internal circuit 18 on the chip will be erroneously operated. In order to prevent the $V_{SS}'$ potential in the chip from significantly fluctuating when the output is changed, gate driving potential VGN for N-channel MOS transistor Qn is generally changed at a small variation rate as shown in FIG. 2B and 5 ns or more time is assigned to change the output.

Likewise, in a case where the potential of output terminal 14 is inverted from the low level to the high level, gate driving potential VGP for P-channel MOS transistor Qp is smoothly changed in order to prevent the $V_{DD}'$ potential in the chip from significantly fluctuating.

As described above, in order to prevent the erroneous operation due to the power source potential variation, the driving ability of inverters 16 and 17 of output control circuit 15 is suppressed to delay the output thereof in the prior art so as to smoothly change gate driving potentials VGN and VGP.

A data line has a parasitic capacitance of approx. 2 pF and it will take 5 ns or more for the column decoder to drive the data line. This is because the operation speed of the column sense amplifier is slow since it amplifies a small signal such as memory data, and it becomes necessary to drive a large capacitor. Further, in order to suppress variation in the power source potential in the chip when the output is changed, the operation of the output control circuit is delayed by approx. 5 ns. Therefore, the conventional semiconductor memory device is largely limited in reducing the access time, thus making it difficult to realize the high speed access.

SUMMARY OF THE INVENTION

An object of this invention is to provide a semiconductor memory device in which a high speed access can be attained.

According to one embodiment of this invention, there is provided a semiconductor memory device which comprises a memory cell array having memory cells arranged in a matrix form; a column sense amplifier for amplifying data read out from the memory cells in the memory cell array and supplied to the bit lines; an output control circuit connected to receive an output from the column sense amplifier; a first wiring for connecting the column sense amplifier and the output control circuit to each other; output transistors driven and controlled by the output of the output control circuit; and a second wiring for connecting the column sense amplifier and the output transistors to each other and having a wiring length larger than that of the first wiring.

With this construction, since the wiring length from the column sense amplifier to the output control circuit is reduced, the delay of a signal transmitted from the column sense amplifier to the output control circuit can be significantly suppressed. Further, since the wiring length from the output control circuit to the output transistor is set to be long, the gate driving potential for the output transistors will be smoothly changed. Therefore, variation in the power source potential in the chip caused when the output is changed can be suppressed without lowering the driving ability of the output control circuit. That is, the wiring from the output control circuit to the output transistors causes the gate potential of the output transistors to vary smoothly. Therefore, if it is assumed that the total delay time due to the presence of the wiring from the column sense amplifier to the output transistors is the same in the conventional circuit and in this invention, it is not necessary to suppress the driving ability of the output control circuit in this invention and accordingly the access speed can be made higher.

BRIEF DESCRIPTION OF THE DRAWINGS

FIG. 3 is a block diagram showing the construction of a semiconductor memory device according to one embodiment of this invention;

FIG. 7 is a logic circuit diagram showing the detailed construction of an output control circuit included in the circuit of FIG. 4;

FIG. 10 is a circuit diagram showing another detailed construction of a partial circuit included in the circuit shown in FIG. 3.

DESCRIPTION OF THE PREFERRED EMBODIMENTS

Figure 1:
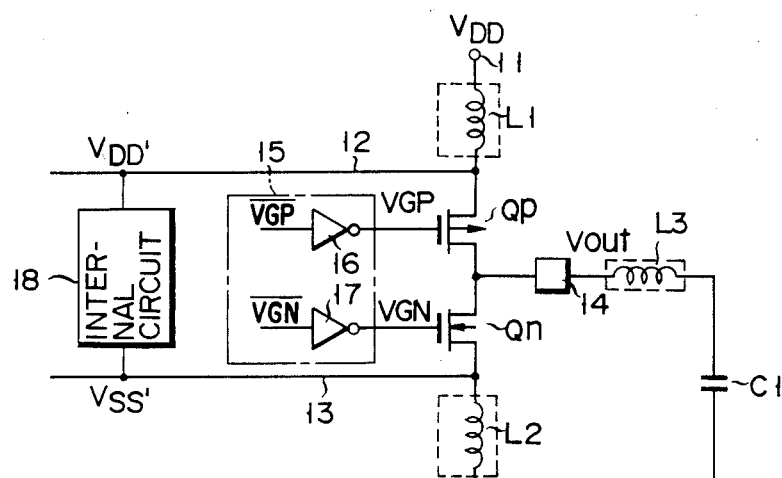
FIG. 1 is a circuit diagram showing an output circuit of the conventional semiconductor memory device.
Figure 2A:
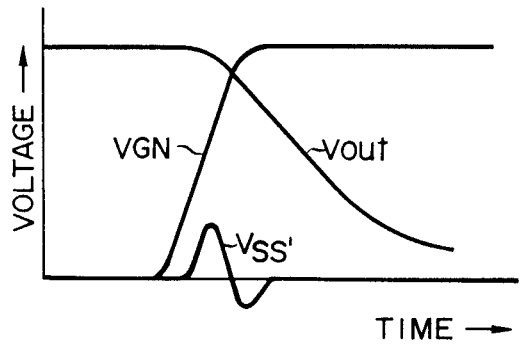
FIGS. 2A and 2B are waveform diagrams showing the potentials set in various portions when the conduction state of an output MOS transistor shown in FIG. 1 is changed.
Figure 2B:
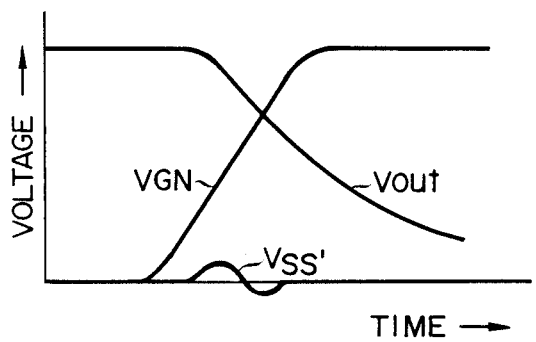
Figure 4:
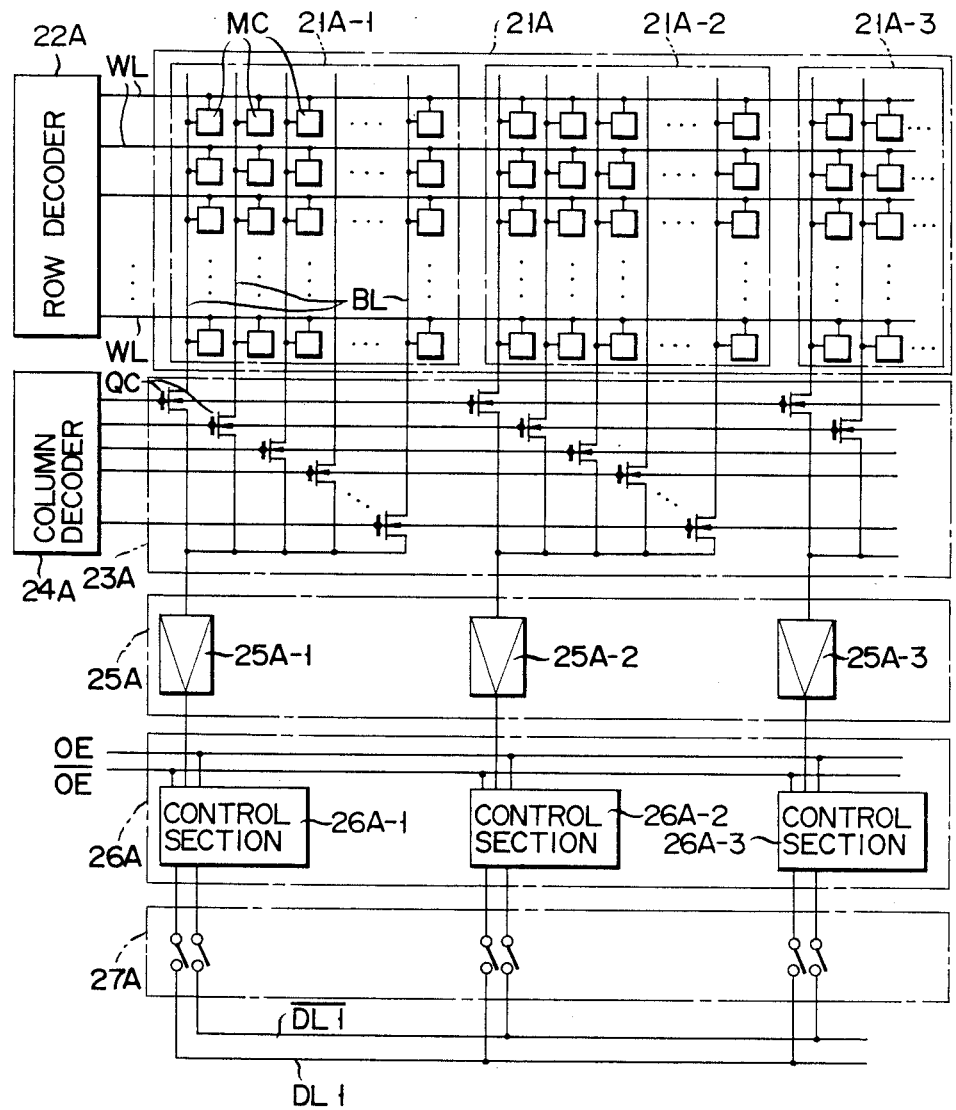
FIG. 4 is a circuit diagram showing the detailed construction of a partial circuit included in a circuit shown in FIG. 3.

FIG. 3 is a block diagram showing the construction of a semiconductor memory device according to one embodiment of this invention. FIG. 4 shows the detail construction of a partial circuit included in a circuit shown in FIG. 3. The memory device is formed with multi-bit configuration (in this example, the 8-bit configuration is shown, and it is generally preferable to use 8 or more output bits in this invention) and has a plurality of circuit sections 20-2 to 20-8 having the same construction as circuit section 20-1 which outputs 1-bit data. Two memory cell arrays 21A and 21B are arranged in circuit section 20-1. Row decoders 22A and 22B; column selection circuits 23A and 23B; column decoders 24A and 24B; column sense amplifiers 25A and 25B; output control circuits 26A and 26B; column block decoders or output selection circuits 27A and 27B; and common data line pairs DL1, $\overline{DL1}$ and DL2. $\overline{DL2}$ are respectively provided for memory cell arrays 21A and 21B. An output from address buffer 28, which receives address signal ADD, is supplied to row decoders 22A and 22B, column decoders 24A and 24B and output selection circuits 27A and 27B. Output of column decoders 24A and 24B are respectively supplied to column selection circuits 23A and 23B. Output enable signals OE and $\overline{OE}$ are supplied to output control circuits 26A and 26B to control the operation thereof. Array selection circuit 29 selects one of the outputs of output selection circuits 27A and 27B.

Redundant memory cells 21AR and 21BR for compensation of defective memory cells are provided in memory cell arrays 21A and 21B. Redundancy selection circuits 23AR and 23BR; sense amplifiers 25AR and 25BR; and output control circuits 26AR and 26BR are respectively provided for redundant memory cells 21AR and 21BR. Redundant memory cells 21AR and 21BR are selected by outputs of row decoders 21A and 21B. Switching circuit 30 is used to select one of the outputs of a section corresponding to redundant memory cells 21AR and 21BR and a section corresponding to memory cell arrays 21A and 21B. An output selected by switching circuit 30 is supplied to output transistors (P-channel MOS transistor Qp and N-channel MOS transistor Qn). A connection node between output transistors Qp and Qn is connected to output terminal 31 from which 1-bit data is read out.

Row address signals output from row decoders 22A and 22B in circuit section 20-1 are also supplied to the memory cell arrays and redundant memory cells in other circuit sections 20-2 to 20-8.

As shown in FIG. 4, a number of memory cells MC are arranged in a matrix form in memory cell array 21A. Rows in memory cell array 21A are respectively connected to word lines WL, and columns therein are respectively connected to bit lines BL. Further, word lines WL are connected to output terminals of row decoder 22A, and bit lines BL are connected to column selection circuit 3A. Column selection circuit 22A includes column selection MOS transistors Qc whose current paths are connected at one end to respect bit lines BL. The other ends of column selection MRS transistors Qc corresponding to one of memory cell array blocks 21A-1, 21A-2, 21A-3, —are commonly connected to a corresponding one of amplifiers 25A-1, 25A-2, 25A-3, —of column sense amplifier 25A. In this way, memory cell array 21A is divided into memory cell array blocks 21A-1, 21A-2, 21A-3, —each including a plurality of columns. Output signals from amplifiers 25A-1, 25A-2, 25A-3, —of column sense amplifier 25A are respectively supplied to control sections 26A-1, 26A-2, 26A-3, —of output control circuit 26A which is arranged adjacent thereto. Output control circuit 26A is operated in response to output enable signals OE and $\overline{OE}$. An output signal of output control circuit 26A is supplied to column block decoder or output selection circuit 27A. Data read out via one of blocks 21A-1, 21A-2, 21A-3, — selected by means of output selection circuit 27A is supplied to data lines DL1 and $\overline{DL1}$.

Memory cell array 21B has same construction as the circuit shown in FIG. 4.

Figure 5:
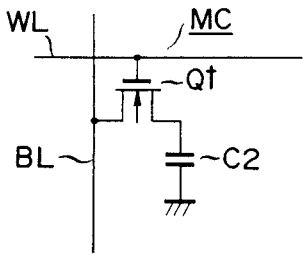
FIG. 5 is a circuit diagram showing the construction of a memory cell in a circuit shown in FIG. 4.
Figure 6:
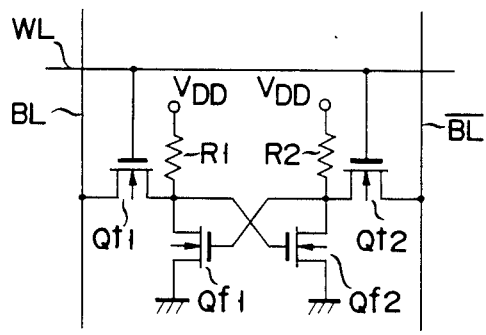
FIG. 6 is a circuit diagram showing another construction of the memory cell in a circuit shown in FIG. 4.

As shown in FIG. 5, for example, memory cell MC is constituted to include one transfer gate MOS transistor Qt and one capacitor C2. Memory cell MC is not limited to a dynamic type, but can be a static type. As shown in FIG. 6, for example, memory cell MC of static type can be used which includes transfer gate MOS transistors Qt1 and Qt2, and MOS transistors Qf1, Qf2 and load resistors R1, R2 constituting a flip-flop. Memory cell MC is connected to one word line WL and a pair of bit lines BL and $\overline{BL}$. Further, memory cell MC is not limited to a memory cell for RAM, but can be memory cell for ROM or EPROM.

Each of the control sections constituting output control circuits 26A, 26B, 26AR, and 26BR is formed of a NOR gate 32, NAND gate 33, and inverters 34 and 35 as shown in FIG. 7, for example. That is, output enable signal $\overline{OE}$ and an output signal of the amplifier section of the pre-stage column sense amplifier are supplied to NOR gate 32, and output enable signal OE, which is a complementary signal of signal 0) and an output signal of the amplifier section of the pre-stage column sense amplifier are supplied to NAND gate 33. An output of NOR gate 32 is supplied to inverter 34 and an output of NAND gate 33 is supplied to inverter 35.

Now, the operation of the above memory device is schematically explained. Address signal ADD is supplied to and temporarily stored in address less buffer 28. Address signal ADD temporarily stored in address buffer 28 is supplied to the row decoder, column decoder and output selection circuit in each of circuit sections 20-1 to 20-8. Row addresses output from row decodes 22A and 22B are commonly used in each of circuit sections 20-1 to 0-8. Each of circuit sections 20-1 to 20-8 is operated in basically the same manner, and therefore the operation of circuit section 20-1 is explained as a typical example. First, memory cells MC in memory cell array 21A are selected by row decoder 22A and column decoder 24A. At this time, memory cells MC connected to the same word line WL are activated, and one column is selected in each of blocks 21A-1 21A-2, 21A-3, —by selectively turning on or off column transistors selection transistors Qc according to output signals of column decoder 24A. As a result, readout data from selected memory cells MC in respective blocks 21A-1, 21A-2, 21A-3, —are supplied to and amplified by amplifier sections 25A-1, 25A-2, 25A-3, —in column sense amplifier 25A. One of the outputs from amplifier sections 25A-1, 25A-2, 25A-3, —is selected by output selection circuit 27A. Outputs from a selected one of the amplifier sections are supplied to a pair of data lines DL1 and $\overline{DL1}$.

Memory cells MC in memory cell array 21B are selected by row decoder 22B and colunn decoder 24B. In the same manner as described above, outputs of a selected one of output selection circuits 27B are supplied to data lines DL2 and $\overline{DL2}$. Then, data supplied to the data lines connected to one of the memory cell arrays selected by array selection circuit 29 is supplied to switching circuit 30. If the selected memory cell is defective, switching circuit 30 functions to select redundant memory cell 21AR and 21BR instead of the selected memory cell. In this way, if the selected memory cell is not deffective, the output of array selection circuit 30 is supplied to the gates of output transistors Qp and Qn. In contrast if the selected memory cell is defective, one o the redundant cells is selected and readout data from the selected redundant memory cell is supplied to the gates of output transistors Qp and Qn. Thus, the conduction states of output transistors Qp and Qn are controlled by the memory data in the selected memory cell, causing 1-bit data to be output from output terminal 31.

In the same manner as described above, 1-bit data is output from each of circuit sections 20-2 to 20-8. As a result 8-bit data is output from the memory device.

Figure 8:
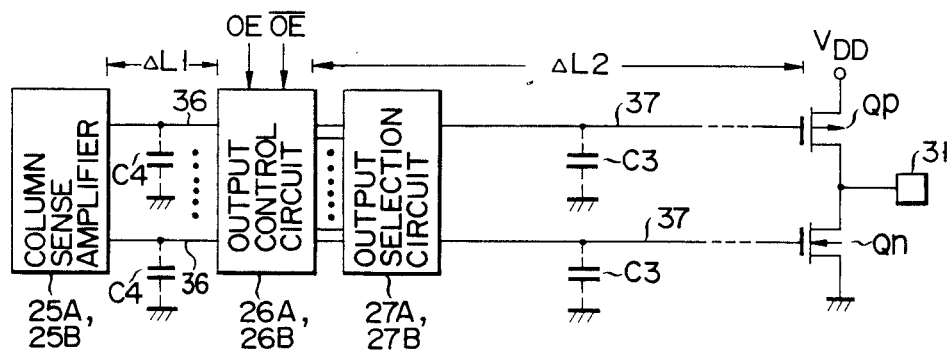
FIG. 8 is a schematic diagram of the present invention.

The feature of the above memory device lies in the arrangement of column sense amplifiers 25A and 25B, output control circuits 26A and 26B, and output transistors Qp and Qn. That is, as shown in FIG. 8, wiring length $\Delta L1$ of wiring 36 between output control circuits 26A, 26B and column sense amplifiers 25A, 25B respectively provided for memory cell arrays 21A, 21B is set to be shorter than wiring length L2 of wiring 37 between output control circuits 26A, 26B and output transistors Qp, Qn. That is, output control circuit bits 26A, 26B are arranged adjacent to and at the latter stage of column sense amplifiers 25A, 25B, and output transistors Qp, Qn are arranged at a distance from output control circuits 26A, 26B. It is preferable to set parasitic capacitor C3 of wiring 37 equal to at least five times the parasitic capacitor C4 of wiring 36. As a result, the delay time of data transmitted along wiring 37 is set to be significantly larger than that of data transmitted along wiring 36.

Likewise, the wiring length between output control circuits 26AR, 26BR and sense amplifiers 25AR, 25BR respectively provided for redundant memory cells 21AR, 21BR is set to be shorter than that between output control circuits 26AR, 26BR and output transistors Qp, Qn.

Figure 9:
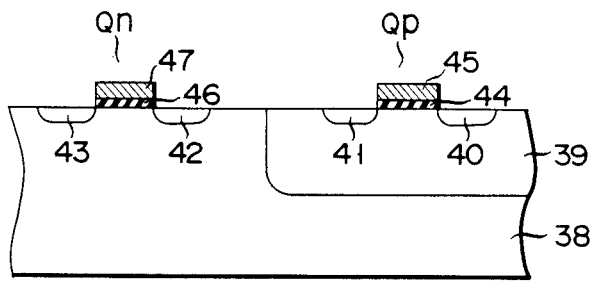
FIG. 9 is a cross sectional view showing the detailed construction of the output transistors in the circuit of FIGS. 3 and 8.

Output transistors Qp and Q are formed to have a cross section shown in FIG. 9. for example, if semiconductor substrate 38 is of P type, N type well region 39 is formed in the main surface are of substrate 38, and source and drain regions 40 to 43 of P-channel and N-channel MOS transistors Qp and Qn are respectively formed in the surface areas of well region 39 and substrate 38. Further, gate electrode 45 is formed on gate insulation film 44 with a thickness of 250Å which is formed on well region 39 lying between source and drain regions 40 and 41. Likewise, gate electrode 47 is formed on gate insulation film 46 with a thickness of 250Å which is formed on substrate 38 lying between source and drain regions 42 and 43.

In the memory device of the above construction, since wiring length L1 or wiring 36 from column sense amplifiers 25A, 25B to output control circuits 26A, 26B is set to be short and the load capacitor (parasitic capacitor C4) is small, the delay of data caused in column sense amplifiers 25A, 25B to be driven is suppressed to a minimum even if the driving ability of column sense amplifiers 25A, 25B is small. In contrast, wiring length L2 of wiring 37 from output control circuits 26A, 26B to output transistors Qp, Qn is set to be long and the load capacitor (parasitic capacitor C3) to be driven becomes large. As a result, fluctuation in the power source potential in the chip caused when the output is changed (when the conduction states of transistors Qp and Qn are changed) can be suppressed. In other words, parasitic capacitor C3 of wiring 37 from output control circuits 26A, 26B to output transistors Qp, Qn functions to make variation in the gate potential of output transistors Qp, Qn smooth. Therefore, it is not necessary to suppress the driving ability of output control circuits 26A and 26B. Assume now that the total delay time of data due to the presence of wiring 36 and 37 from column sense amplifiers 25A, 25B to output transistors Qp, Qn is the same in the prior art circuit and in this invention. Then, the higher access speed can be attained in this invention since it is not necessary to delay outputs of output control circuits 26A, 26B. In this case, the area of the chip may be slightly increased in comparison with the structure in which one output control circuit (corresponding to one control section in the output control circuit of this invention) is arranged at the front stage of the output transistor. However, in a semiconductor memory device which is required to be operated at a high speed, increases in the chip area can be neglected. Further, the chip area can be minimized by selectively putting a plurality of columns together to form groups of columns in column selection circuits 23A, 23B and connecting the columns in the same group to the same amplifier section in column sense amplifiers 25A, 25B.

In the circuit of FIG. 4, memory cell array 21A is divided into a plurality of blocks 21A-1, 21A-2, 21A-3, etc. However, it is possible to select each column by column selection circuit 23A without dividing memory cell array 21A into a plurality of blocks. In this case, it becomes necessary to provide an amplifier section in column sense amplifier 25A, a control section in output control circuit 26A and a switching section in output selection circuit 27A for each column as shown in FIG. 10.

Further, in FIG. 7, the control section of output control circuit 26A is constructed to effect the tristate (high level state, low level state and high impedance state) control with respect to output terminal 31. However, it is not limited to this construction, and a control circuit which can effect more complicated control operation can be used.

As described above, according to this invention, a semiconductor memory device which can attain the high access operation can be provided.

What is claimed is:

1. A semiconductor memory device, comprising:
   a memory cell array having memory cells arranged in a matrix form;
   column sense amplifier means for amplifying data read out from the memory cells in said memory cell array and supplied to bit lines;
   output control means connected to receive an output from said column sense amplifier means;
   a first wiring for connecting said column sense amplifier means and said output control means to each other, the first wiring having a parasitic capacitance;
   output transistors, driven and controlled by the output of said output control means; and
   a second wiring for connecting said output control means and said output transistors to each other and having a wiring length larger than that of the first wiring, the second wiring having a parasitic capacitance at least five times the parasitic capacitance of the first wiring.

2. A semiconductor memory device according to claim 1, wherein the delay time of a signal due to said second wiring is longer than that of a signal due to said first wiring.

3. A semiconductor memory device according to claim 1, wherein said column sense amplifier means includes amplifier sections respectively coupled to columns of memory cells of said memory cell array.

4. A semiconductor memory device according to claim 1, wherein said column sense amplifier means includes amplifier sections each coupled to a plurality of columns of memory cells of said memory cell array.

5. A semiconductor memory device according to claim 1, wherein said output transistors include MOS transistors whose current paths are serially connected between power source terminals.

6. A semiconductor memory device according to claim 1, wherein the semiconductor memory device has output bits of more than 8 bits.

7. A semiconductor memory device according to claim 1, wherein said output control means further includes a plurality of control sections, each having an output, and an output selection means for selecting one output from said plurality of control sections, an output terminal of said output selection means being connected to control input terminals of said output transistors via said second wiring.

8. A semiconductor memory device according to claim 7, wherein said second wiring includes a common data line.

9. A semiconductor memory device according to claim 7, wherein each of said plurality of control sections includes a NOR gate connected to receive an output signal from a corresponding amplifier section in said column sense amplifier means and an output enable signal; a NAND data connected to receive an output signal from a corresponding amplifier section and an inverted signal of said output enable signal; a first inverter for inverting an output signal of the NOR gate and outputting a first inverted signal from the control section; and a second inverter for inverting an output signal of the NAND gate and outputting a second inverted signal from the control section.

* * * * *